(12) United States Patent
Yazawa

(10) Patent No.: US 7,369,409 B2
(45) Date of Patent: May 6, 2008

(54) APPARATUS, METHOD, AND CONTROL PROGRAM FOR COOLING ELECTRONIC DEVICES

(75) Inventor: Kazuaki Yazawa, Chiba (JP)

(73) Assignee: Sony Computer Entertainment Inc., Tokyo (JP)

(*) Notice: Subject to any disclaimer, the term of this patent is extended or adjusted under 35 U.S.C. 154(b) by 47 days.

(21) Appl. No.: 11/166,919

(22) Filed: Jun. 24, 2005

(65) Prior Publication Data

US 2005/0280994 A1    Dec. 22, 2005

Related U.S. Application Data

(63) Continuation of application No. PCT/JP2004/014613, filed on Oct. 4, 2004.

(30) Foreign Application Priority Data

Dec. 15, 2003    (JP) .............................. 2003-417045

(51) Int. Cl.
*H05K 7/20*    (2006.01)
*F28F 7/00*    (2006.01)

(52) U.S. Cl. .................... 361/698; 165/80.4; 165/908; 361/699

(58) Field of Classification Search ................ 165/908; 361/698–699
See application file for complete search history.

(56) References Cited

U.S. PATENT DOCUMENTS

| | | | | |
|---|---|---|---|---|
| 5,907,473 | A * | 5/1999 | Przilas et al. ................ | 361/699 |
| 6,817,196 | B2 * | 11/2004 | Malone et al. ................ | 62/171 |
| 6,952,346 | B2 * | 10/2005 | Tilton et al. ................ | 361/699 |
| 6,988,534 | B2 * | 1/2006 | Kenny et al. .............. | 165/80.4 |
| 7,104,312 | B2 * | 9/2006 | Goodson et al. ........... | 165/80.4 |
| 2003/0011987 | A1 | 1/2003 | Chu et al. | |
| 2003/0226371 | A1 | 12/2003 | Rini | |

FOREIGN PATENT DOCUMENTS

| | | |
|---|---|---|
| JP | 1140969 | 6/1989 |
| JP | 4206556 | 7/1992 |
| JP | 6-275752 | 9/1994 |
| JP | 7-245363 | 9/1995 |
| JP | 7245363 | 9/1995 |
| JP | 8-159635 | 6/1996 |
| JP | 8-316673 | 11/1996 |

(Continued)

OTHER PUBLICATIONS

Notification of Reason(s) for Refusal dated Dec. 21, 2004.

(Continued)

*Primary Examiner*—Gregory D Thompson
(74) *Attorney, Agent, or Firm*—Katten Muchin Rosenman LLP

(57) ABSTRACT

A thermal distribution detecting unit detects a thermal distribution state on a surface of an electronic device. An emission control unit identifies a position to be cooled in accordance with the thermal distribution state detected. A nozzle selecting unit selects a cooling nozzle corresponding to the position. An emission time computing unit computes a coolant emission time and timing for the cooling nozzle. Upon reception of an instruction from the emission control unit, a drive unit drives a nozzle unit, thereby allowing a jet of coolant to impinge upon the electronic device.

19 Claims, 15 Drawing Sheets

FOREIGN PATENT DOCUMENTS

| | | |
|---|---|---|
| JP | 11-040969 | 2/1999 |
| JP | 11-40969 | 2/1999 |
| JP | 2001-221529 | 8/2001 |
| JP | 2002-026555 | 1/2002 |

OTHER PUBLICATIONS

International Preliminary Report on Patentability and Written Opinion of the International Searching Authority dated Jul. 27, 2006, from corresponding International Application PCT/JP2004/014613.

Korean Office Action dated Sep. 28, 2006, for corresponding Korean Application 2005-7014176.

Notice of Rejection Reason(s) dated Nov. 22, 2005 with translation.

Supplementary Partial European Search Report dated May 30, 2007, for corresponding European Patent Application No. 04 79 2024.

Notification of Reason(s) for Refusal dated Apr. 16, 2007 for corresponding Korean Patent Application No. 2005-7014176.

Chinese Office Action dated Apr. 27, 2007, for corresponding Chinese Patent Application No. 200480004147.2.

\* cited by examiner

FIG.12

| POSITION ID | X-COORDI-NATE | Y-COORDI-NATE | $t_1$ | $t_2$ | $t_3$ | $t_4$ | $t_5$ | ... | $t_{10}$ |
|---|---|---|---|---|---|---|---|---|---|
| 01 | -50.0 | -50.0 | 68.5 | 60.0 | 50.0 | 40.5 | 40.5 | | 17.0 |
| 02 | -30.0 | -50.0 | 61.0 | 55.0 | 40.0 | 32.0 | 30.0 | | 17.0 |
| 03 | -10.0 | -50.0 | 24.0 | 50.0 | 31.0 | 34.0 | 30.0 | | 19.5 |
| 04 | +10.0 | -50.0 | 35.0 | 45.0 | 31.5 | 31.0 | 29.5 | | 20.0 |
| 05 | +30.0 | -50.0 | 40.0 | 42.0 | 32.0 | 25.0 | 29.0 | | 20.5 |
| 06 | +50.0 | -50.0 | 45.0 | 40.0 | 31.0 | 26.5 | 26.0 | | 20.0 |
| 07 | -50.0 | -30.0 | 54.0 | 51.0 | 42.0 | 30.5 | 30.5 | | 17.0 |
| 08 | -30.0 | -30.0 | 21.0 | 41.0 | 18.0 | 14.0 | 11.0 | | 22.0 |
| 09 | -10.0 | -30.0 | 26.0 | 48.0 | 29.0 | 32.0 | 29.5 | | 20.5 |
| 010 | +10.0 | -30.0 | 40.0 | 41.0 | 28.0 | 28.5 | 27.5 | | 21.5 |
| 011 | +30.0 | -30.0 | 42.0 | 44.0 | 34.0 | 22.0 | 28.0 | | 23.5 |
| 012 | +50.0 | -30.0 | 51.0 | 50.0 | 47.0 | 32.0 | 17.0 | | 29.0 |
| ... | ... | ... | ... | ... | ... | ... | ... | | ... |

| PROCESS ID | 01 | 02 | 03 | 04 | 05 | 06 | ... | 36 |
|---|---|---|---|---|---|---|---|---|
| 01 | B | B | B | A | C | C | | B |
| 02 | B | C | C | C | A | B | | B |
| 03 | B | C | A | B | C | C | | B |
| 04 | C | A | A | C | B | C | | B |
| 05 | B | B | C | B | B | B | | B |
| 06 | C | B | B | A | B | C | | A |
| 07 | B | C | C | B | C | B | | C |
| 08 | C | C | B | C | B | C | | A |
| 09 | B | B | B | B | C | B | | B |
| ⋮ | ⋮ | ⋮ | ⋮ | ⋮ | ⋮ | ⋮ | ⋮ | ⋮ |

APPARATUS, METHOD, AND CONTROL PROGRAM FOR COOLING ELECTRONIC DEVICES

CROSS-REFERENCE TO RELATED APPLICATION

This application is a continuation of International Application PCT/JP04/014613 filed on Oct. 4, 2004, pending at the time of filing of this continuation application and claims priority from Japanese Patent Application 2003-417045 filed on Dec. 15, 2003, the contents of which are herein wholly incorporated by reference.

BACKGROUND OF THE INVENTION

1. Field of the Invention

The present invention relates to techniques for cooling electronic devices, and more particularly to a technique for applying the principle of jet heat transfer in cooling the surface of electronic devices.

2. Description of the Related Art

In general, various types of electronic devices, such as CPUs (Central Processing Unit) for controlling electronic products or DSPs (Digital Signal Processor), are made up of various electronic components including active elements such as transistors or passive elements such as capacitors. These electronic components are driven by electric energy, part of which is converted into heat energy to be dissipated. Since the performance of the electronic components typically depends on the temperature, this dissipated heat has adverse effects on the performance of the electronic components and thus on the electronic device. Accordingly, the electronic device cooling technology is extremely critical to providing proper control to electronic devices.

As an example of cooling techniques, there is available a cooling method using an electric fan. In this method, the electric fan is situated opposite to a surface of an electronic device. The electric fan allows cooler air introduced through an air inlet to impinge on the surface of the electronic device. The air heated by absorbing heat generated on the surface of the electronic device is exhausted through an air exhaust outlet. In this manner, heat generated on the surface of the electronic device is removed by the electric fan, thereby cooling the electronic device.

As another example, there is also available a method of cooling electronic devices using cooling water. In this method, the surface of the electronic device is covered with a water-proof case so that cooling water passes the surface of the electronic device. The cooling water heated by absorbing heat generated on the surface of the electronic device is drained through a cooling water drain outlet. In this manner, heat generated on the surface of the electronic device is absorbed by the cooling water, thereby cooling the electronic device (see, for example, Japanese Patent Laid-Open Publication No. 2002-026555 and Japanese Patent Laid-Open Publication No. 2001-221529)

Recent electronic devices tend to increasingly produce larger amounts of heat due to their higher-speed operations, further improved functions, and higher packaging densities. This tendency is now overwhelming the conventional cooling methods that employ air or liquid, making it more difficult to sufficiently cool those electronic devices.

From a macroscopic point of view, the aforementioned conventional cooling methods focus on how to remove heat generated on the surface of electronic devices. However, from a microscopic viewpoint, heat is not uniformly produced on the surface of an electronic device. In general, the electronic components constituting an electronic device are grouped in modules for particular functions. Accordingly, the distribution of heat generated on the surface may vary depending on the processing performed by the electronic device. This is because the electronic device has to provide different functions.

SUMMARY OF THE INVENTION

The present invention was developed in view of the aforementioned problems. It is therefore an object of the invention to provide a technique for effectively cooling electronic devices.

According to an aspect of the present invention, provided is an electronic device cooling apparatus. This apparatus comprises: a nozzle unit which has a plurality of cooling nozzles placed proximately opposite to a surface of an electronic device; a drive unit which actuates a coolant introduced into the nozzle unit to emit the coolant through the cooling nozzles; and an emission drive control unit which controls an emission drive capacity of the drive unit.

As used herein, the term "coolant" refers to a medium for absorbing and removing heat generated on the surface of an electronic device, the medium being a gas such as air or a liquid such as water. According to this aspect, a coolant introduced into the nozzle unit is ejected through a cooling nozzle to impinge on the surface of the electronic device, thereby removing heat generated on the surface of the electronic device. As discussed in more detail later, the coolant is emitted as a jet stream to impinge on the surface of the electronic device, thereby locally increasing the heat transfer coefficient. The coolant may be emitted to impinge on the surface of the electronic device for direct cooling or on a case covering the surface of the electronic device for indirect cooling. Hereinafter, a method for emitting a coolant to impinge on a heat producing body such as an electronic device to thereby cool the heat producing body is referred to as the "jet cooling." Additionally, the point of impingement of a jet stream along the jet axis of the cooling nozzle on the surface of the electronic device is referred to as the "jet axis point."

In particular, the jet cooling by using a cooling nozzle can effectively remove heat generated in the vicinity of the jet axis point. The larger the number of cooling nozzles placed as well as the higher the cooling nozzle capability of emitting a coolant, the greater the cooling effect becomes. If a particular unit of an electronic device at which a larger amount of heat is produced can be predicted, cooling nozzles may be intensively placed in the vicinity of that unit. Alternatively, a cooling nozzle having its jet axis point in the vicinity of such a unit may be designed to emit an enhanced jet stream. For example, such a cooling nozzle may be designed to have an increased coolant jet orifice area or provide jet streams at increased speeds. The electronic device cooling apparatus may be integrated with the electronic device or separately provided as a single module.

The nozzle unit of this apparatus may comprise a main set of nozzles and a sub set of nozzles, the main and sub sets of nozzles each having a plurality of the cooling nozzles arranged densely. In a horizontal direction to the surface of the electronic device, the sets of nozzles may be placed in a shifted configuration. In the normal direction to the surface of the electronic device, the main and sub sets of nozzles may be placed in a staggered configuration.

The larger the number of cooling nozzles of the nozzle unit, the larger the number of jet axis points on the electronic device becomes. This provides an enhanced overall cooling effect to the electronic device. According to this aspect of the invention, the nozzle unit is divided into the main and sub sets of nozzles. The main and sub sets of cooling nozzles are designed to alternately have their coolant jet orifices. This arrangement allows for a denser placement of the cooling nozzles. The main and sub sets of nozzles may also be placed in a staggered configuration when disposed opposite to the surface of the electronic device.

This apparatus may further comprise a thermal distribution detecting sensor which detects a thermal distribution state on the surface of the electronic device, and the emission drive control unit may control the drive unit in accordance with the thermal distribution state detected.

As used herein, the term "thermal distribution state" may be a distribution of heat being generated as a temperature distribution on the surface of the electronic device or a distribution of rates of changes in the amount of heat generated. For example, the "thermal distribution detecting sensor" may be a temperature sensor which is embedded inside the electronic device, or alternatively an infrared sensor disposed external to the electronic device to detect infrared radiation emitted from the surface of the electronic device. The electronic device can be effectively cooled by driving the cooling nozzle in accordance with the thermal distribution state on the surface of the electronic device. For example, a cooling nozzle that has its jet axis point in the vicinity of a unit generating a larger amount of heat may be selectively driven to emit the coolant. In this case, cooling can be provided more effectively than when all the other cooling nozzles are driven simultaneously. The selective driving of the cooling nozzles may also reduce the amount of coolant used and the power consumption required for driving the drive unit.

The emission drive control unit of the apparatus may also control a coolant emission time, during which the drive unit allows the cooling nozzle to emit the coolant therethrough, in accordance with the thermal distribution state detected.

For example, a cooling nozzle that has its jet axis point in the vicinity of a unit generating a larger amount of heat may be controlled to emit the coolant for a longer period of time, thereby cooling the electronic device more effectively.

The emission drive control unit of the apparatus may also control the drive unit such that a jet of the coolant is emitted by the cooling nozzle corresponding to the position most desired to be cooled and then by its surrounding cooling nozzles in sequence, thereby forming a pulsing stream of the coolant in a predetermined direction.

Driving a cooling nozzle to emit a jet of coolant onto the surface of the electronic device causes heat generated in the vicinity of its jet axis point to be absorbed by the coolant and then dissipated in its surroundings. This dissipated heat may continue to stay around the jet axis point. In such a case, after the cooling nozzle has been driven, the cooling nozzles located around it are sequentially driven. This allows the heat generated in the vicinity of the jet axis point to be dissipated in a pulsing flow out of the electronic device. Accordingly, the dissipated heat is effectively removed from the surface of the electronic device. When control is provided in this manner, the heat generated on the surface of the electronic device can be effectively removed therefrom.

The emission drive control unit of the apparatus may also control the drive unit such that the pulsing stream of the coolant formed is directed to a heat exhaust hole.

When the heat exhaust hole is available for collecting heat generated on the surface of the electronic device, a cooling nozzle can be driven to direct the coolant having absorbed the heat to the heat exhaust hole, thereby more effectively removing the heat generated on the surface of the electronic device.

This apparatus may also comprise a thermal distribution predicting unit which predicts a thermal distribution state on the surface of the electronic device, and the emission drive control unit may also control the drive unit in accordance with the thermal distribution state predicted.

For example, the thermal distribution state on the surface of the electronic device may be detected by a thermal sensor as appropriate to record information on the resulting thermal distribution state on a storage medium as a history (the history information on the thermal distribution state recorded is hereinafter referred to as the "thermal distribution history information"). A future thermal distribution state may be predicted based on the thermal distribution history information to select a cooling nozzle that has its jet axis point in the vicinity of a unit, at which an increase in the amount of heat generated is expected, for emission of the coolant. According to this aspect of the invention, a predetermined unit of the electronic device can be cooled in advance before the temperature at the unit actually rises. The thermal distribution predicting unit of the apparatus may also predict a thermal distribution state in accordance with the contents of processing that is to be performed by the electronic device.

The thermal distribution on the surface of the electronic device varies depending on the processing to be performed by the electronic device. For example, depending on the contents of an instruction to be executed by a CPU, a particular module in the CPU may be frequently driven or may scarcely be driven. For this reason, the thermal distribution may be predicted depending on the processing to be executed by the electronic device. The prediction may be made in accordance with the type of software to be executed or the working function of the software. For example, when separately executed, a communication module and a 3D rendering module in a certain piece of software may be considered to mainly drive different modules in the electronic device.

The thermal distribution predicting unit may predict a thermal distribution based on data that defines predicted thermal distribution states of the electronic device corresponding to the contents of processing to be performed by the electronic device (the data being hereinafter referred to as the "thermal distribution correlation data"). That is, in accordance with the contents of the processing that is to be performed by the electronic device, the corresponding predicted information may be read from the thermal distribution correlation data to predict the thermal distribution.

According to another aspect of the present invention, also provided is an electronic device cooling apparatus. This apparatus comprises: a nozzle unit which has a plurality of cooling nozzles placed proximately opposite to a surface of an electronic device; a drive unit which actuates a coolant introduced into the nozzle unit to emit the coolant through each of the cooling nozzles; a thermal distribution detecting sensor which detects a thermal distribution state on the surface of the electronic device; a nozzle selecting unit which identifies a position to be cooled in accordance with the thermal distribution state detected and selecting the cooling nozzle corresponding to the position identified; and an emission drive control unit which allows the drive unit to emit the coolant through the cooling nozzle selected.

A cooling nozzle to be driven is selected in accordance with the thermal distribution state on the surface of the electronic device. For example, the coolant is emitted through a cooling nozzle that has its jet axis point in the vicinity of a unit generating the largest amount of heat. In this case, a better effect of heat absorption can be conceivably provided than by other cooling nozzles. This realizes the optimal control of the cooling nozzles.

This apparatus may also comprise an emission time computing unit which calculates a coolant emission time for a selected cooling nozzle in accordance with the thermal distribution state detected. The emission drive control unit may allow the drive unit to emit the coolant through the cooling nozzle selected for a duration of the coolant emission time calculated. This apparatus may also comprise an emission timing computing unit which calculates a coolant emission timing for a selected cooling nozzle in accordance with the thermal distribution state detected. The emission drive control unit may allow the drive unit to emit the coolant through the cooling nozzle selected with the coolant emission timing calculated.

Incidentally, any combinations of the foregoing components of the present invention expressed by methods, apparatuses, systems, recording media, computer programs, and the like are also intended to constitute applicable aspects of the present invention.

BRIEF DESCRIPTION OF THE DRAWINGS

FIG. 12 is a table showing the data structure of a thermal distribution history information storage unit;

FIG. 13 is a table showing the data structure of a thermal distribution correlation data storage unit;

Explanation of Symbols

Figure 1:
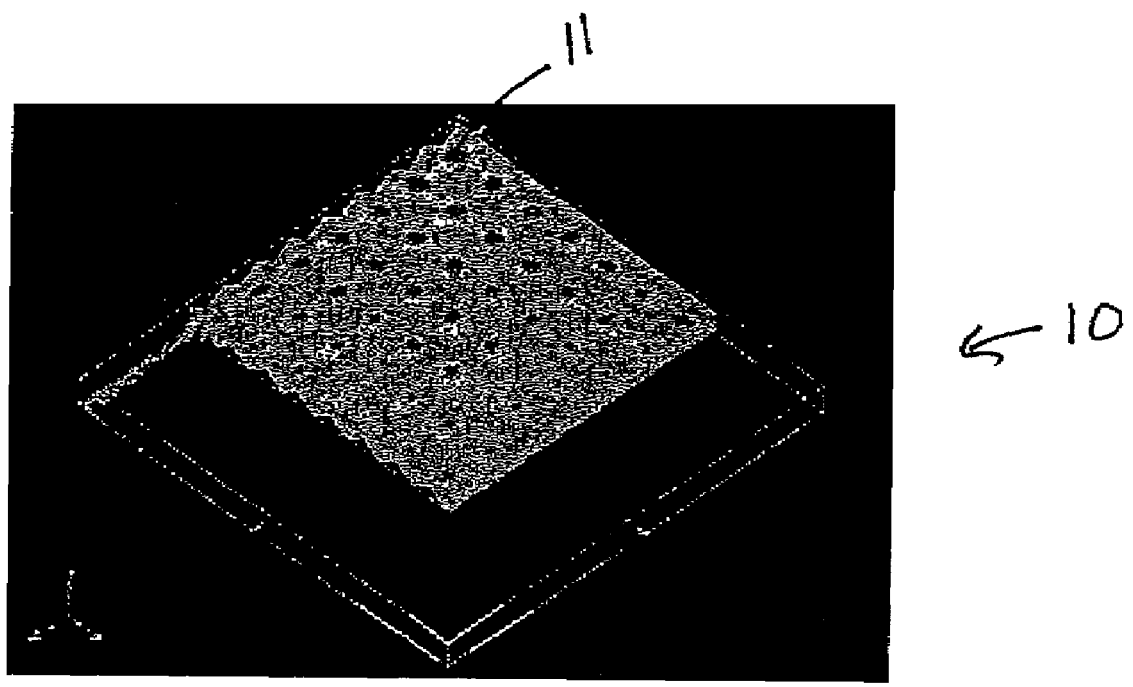
FIG. 1 is a view showing a computer simulated heat transfer with cooling nozzles disposed in rows and columns opposite to a surface of an electronic device.

100—Electronic Device Cooling Apparatus; 104—Chamber; 106—Movable Membrane; 110—Cooling Nozzle; 150—Top Substrate; 152—Connector; 160—Emission Control Unit; 162—Nozzle Map Storage Unit; 164—Pulsation Computing Unit; 166—Thermal Distribution History Information Storage Unit; 168—Emission Time Computing Unit; 170—Thermal Distribution Predicting Unit; 172—Thermal Distribution Correlation Data Storage Unit; 174—Performed Processing Detecting Unit; 178—Thermal Distribution Detecting Unit; 180—Nozzle Selecting Unit; 182—Drive Unit; 184—Nozzle Unit; 200—Electronic Device; 246—Temperature Sensor

DETAILED DESCRIPTION OF THE PREFERRED EMBODIMENTS

Heat is generated on the surface of electronic devices such as CPUs or DSPs. This heat originates from the electric energy that is supplied to electronic components in the electronic device or to conductors connecting between the electronic components and then converted into heat energy to dissipate. This heat is not produced uniformly on the surface of the electronic device.

As previously described herein, techniques for cooling the surface of an electronic device include an air cooling method using an electric fan or a liquid cooling method using cooling water being circulated. These methods focus not on how to provide cooling of heat generated locally on the surface of the electronic device but merely on how to provide cooling of heat generated globally on the surface of the electronic device.

In general, the liquid cooling method provides a greater cooling effect than the air cooling method. However, in the liquid cooling method, since a chip package of the electronic device is separated from a cooling module, there is a problem that heat generated on the surface of the electronic device experiences a high interface thermal resistance in conducting to the cooling module. Generally, the interface between the cooling module and the chip package traps a small amount of air, which serves as a heat insulator. This air impedes the absorption of heat by the cooling module. The air can be removed by applying a grease to the interface, thereby somewhat improving the heat absorption efficiency. However, with increasing performance of electronic devices, cooling by the conventional liquid cooling method seems to be approaching its limit.

In view of these circumstances, the present invention suggests a paradigmatically novel technique which applies the principle of jet cooling in cooling electronic devices.

Prior to the description of embodiments, an explanation will be given to the principle of jet cooling.

The jet cooling is a cooling method that is known to provide a high local heat transfer efficiency. For example, this method, which is effectively applicable to cooling of a large amount of heat locally generated during machining, allows a jet of coolant to impinge on a heat producing body through a cooling nozzle. On a plane normal to the jet stream of coolant, heat is transferred concentrically around the jet axis point.

The heat transfer coefficient $h_0$ [W/m²K] is expressed by $$h_0 = \lambda_f \cdot nu_0 / \square_0 \quad \text{(Equation 1)}$$

where $r_0$[m] is the impinging radius and $\lambda_f$ [W/mK] is the thermal conductivity of fluid. In the equation above, $Nu_0$, the average Nusselt number at an impinging radius of $r_0$ [m], is expressed by $$Nu_0 = 1.25 \cdot Pr^{0.45} \cdot Re^{0.45} \quad \text{(Equation 2)}$$

where Pr is a constant called the Prandtl Number and Re is the Reynolds number. Re is expressed by the following equation;

$$Re = u_0 \cdot d_0 / v \quad \text{(Equation 3)}$$

where $u_0$ [m/s] is a typical speed obtained by dividing the volumetric flow of jet stream by the cross-sectional area of the cooling nozzle jet orifice, $d_0$[m] is the nozzle diameter, and $v$[s/m²] is the viscosity of the fluid.

FIG. 1 is a view of computer thermal image 10 showing a computer simulated heat transfer with cooling nozzles disposed in rows and columns opposite to a surface of an electronic device. In the drawing, darker unit 11 indicates a higher heat transfer coefficient, i.e., a greater effect of cooling. In the drawing, dark unit 11 corresponds to the jet axis point. That is, it is shown that the jet cooling provides a greater cooling effect closer to the jet axis point. Electronic devices including a plurality of processors likely produce heat locally on a surface of the electronic device. The jet cooling provides a particularly grater cooling effect to such an electronic device. In particular, in such an electronic device as a chip that has a plurality of processors embedded to perform parallel processing of multiple tasks independent of each other, a working processor in the chip will produce heat, thereby likely causing heat to be generated locally on the surface of the chip. In such a case, a cooling nozzle may be arranged such that its jet axis point is placed immediately above each of the processors that are embedded in the chip. In the chip, a working processor and a non-working processor produce different amounts of heat. In such a case, the cooling nozzle that has its jet axis point immediately above the working processor is selectively driven to emit a jet of coolant, thereby allowing the chip to be more efficiently cooled than when the overall chip is cooled.

Figure 2:
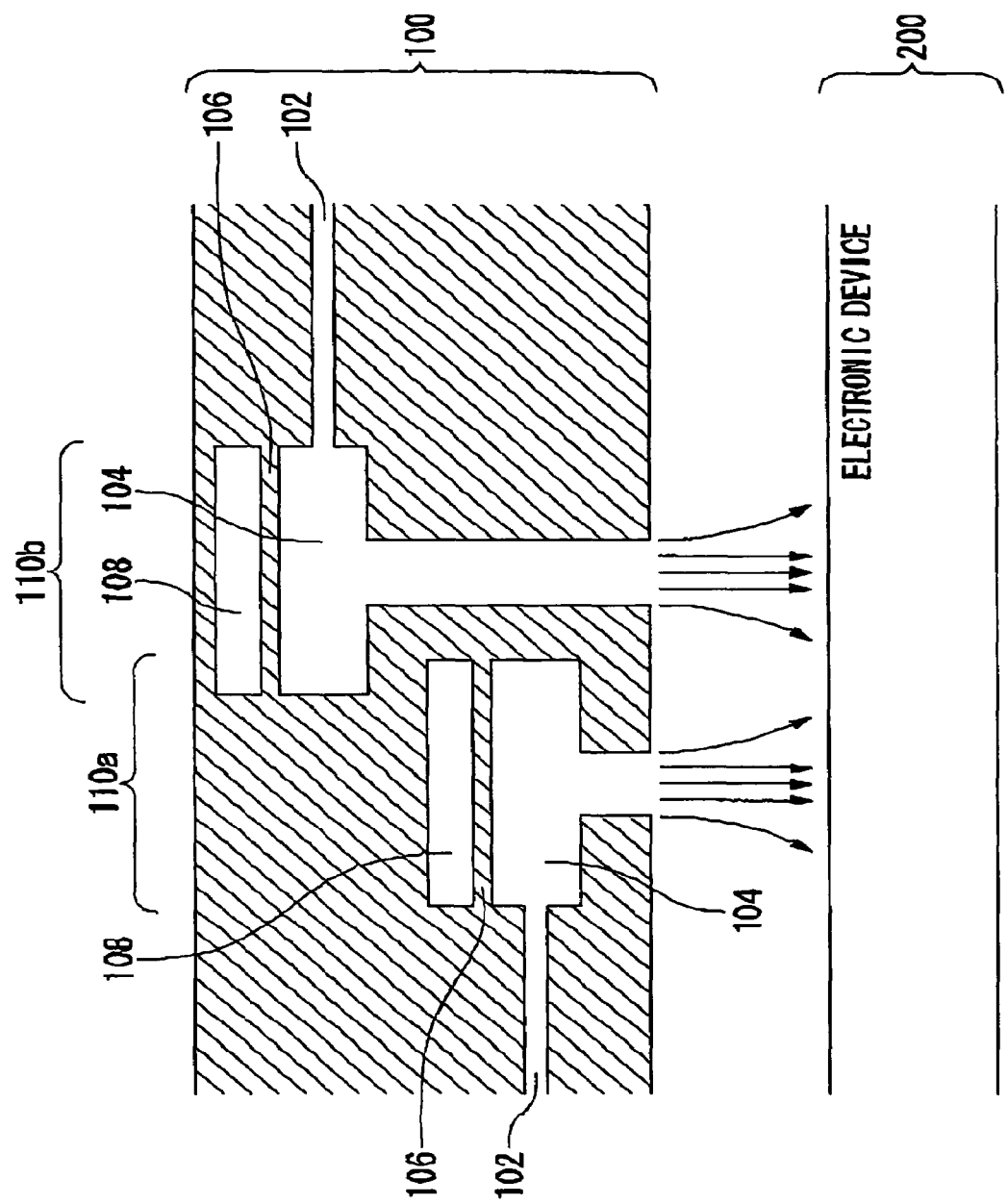
FIG. 2 is a schematic view showing the mechanism of an electronic device cooling apparatus.

FIG. 2 is a schematic view showing the mechanism of an electronic device cooling apparatus 100 according to an embodiment. The electronic device cooling apparatus 100 embeds a plurality of main nozzles 110a and a plurality of auxiliary nozzles 110b. The electronic device cooling apparatus 100 emits a jet of coolant to a surface of an electronic device 200, thereby cooling the electronic device 200. For the coolant being a liquid, the surface of the electronic device 200 is covered with a water-proof case. The main nozzles 110a and the auxiliary nozzles 110b have the same mechanism. The coolant jet orifice of the main nozzles 110a is located closer to the electronic device 200 than that of the auxiliary nozzles 110b, thus having a greater effect of cooling. If a unit of the surface of the electronic device 200 that likely reaches a high temperature is known in advance, the main nozzle 110a may be placed corresponding to that unit. As shown, to place the cooling nozzles 110 at a high density in the electronic device cooling apparatus 100, the main nozzles 110a and the auxiliary nozzles 110b may be embedded in a staggered configuration.

The electronic device cooling apparatus 100 is realized by silicon micromachining or the so-called microfabrication technology. The cooling nozzles 110 are mechanically driven to emit a jet of coolant by MEMS (Micro Electro Mechanical System). More specifically, the coolant is introduced into a chamber 104 via a coolant feed passage 102. The chamber 104 accumulates a small amount of coolant, thereby preventing dry-out. A movable-membrane drive unit 108 drives a movable membrane 106 in response to an external control signal. The movable membrane 106 pushes the coolant accumulated in the chamber 104 toward the electronic device 200, thereby emitting the coolant. The coolant having been impinged on the electronic device 200 is collected in a coolant collecting hole (not shown). The collected coolant may be just discarded or circulated to be reemitted to the electronic device 200. The movable-membrane drive unit 108 may also receive an external control signal to drive the movable membrane 106 by electrostatic or magnetic force or using piezoelectric elements. The fluidic coolant may be a gas such as air or a liquid such as water. For the coolant being a liquid, coolant droplets may be locally heated so as to boil and thermally expand to be thereby emitted.

Figure 3:
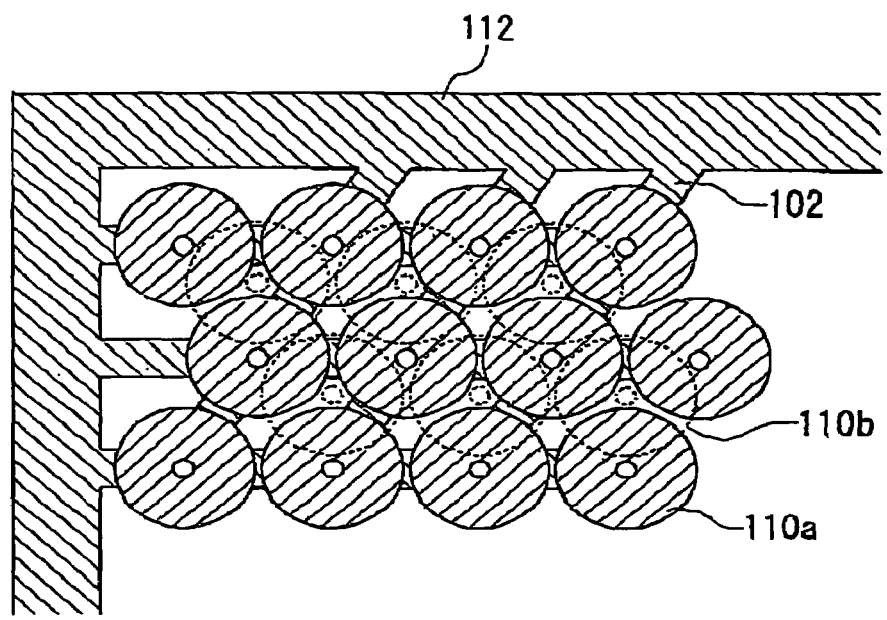
FIG. 3 is a view showing an arrangement of cooling nozzles when viewed in a direction opposite to an electronic device.

FIG. 3 is a view showing an arrangement of the main nozzles 110a and the auxiliary nozzles 110b of FIG. 2 when viewed in a direction opposite to the electronic device. A coolant feed tube 112 supplies a coolant to the main nozzles 110a. The coolant in the coolant feed tube 112 is introduced into the chamber 104 via the coolant feed passage 102. There is also another coolant feed passage (not shown) for feeding the coolant to the auxiliary nozzles 110b. As shown, the main nozzles 110a and the auxiliary nozzles 110b are placed in a staggered configuration, thereby creating jet axis points at a higher density than when only the main nozzles 110a are employed. The main nozzles 110a and the auxiliary nozzles 110b may be placed in rows and columns as shown, or alternatively may be adjusted for placement such that the cooling nozzles are most densely placed at a particular unit on the electronic device.

Figure 4:
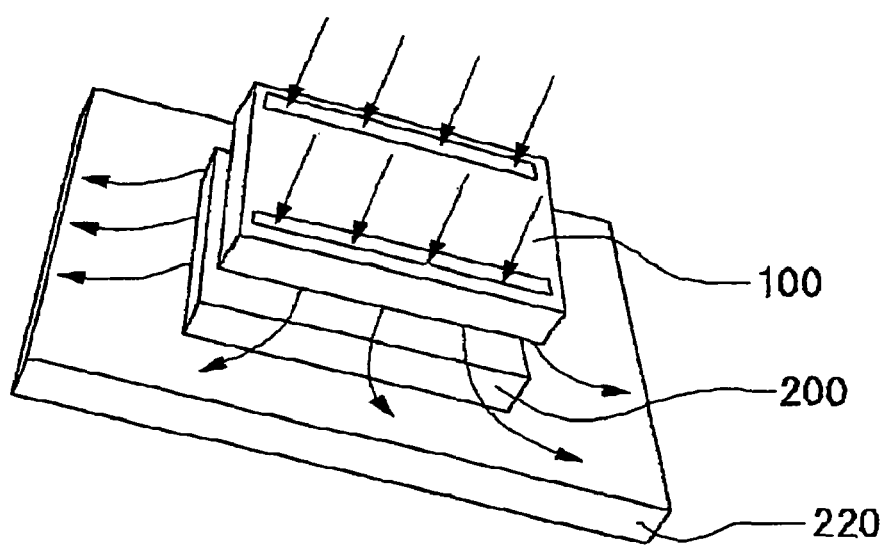
FIG. 4 is a view showing an electronic device cooling apparatus in operation with a coolant of air.

FIG. 4 is a schematic view showing the electronic device cooling apparatus 100 in operation. Here, the coolant is air and the electronic device cooling apparatus 100 is provided as a single module. The electronic device 200 is typically placed on a substrate 220. The electronic device cooling apparatus 100 is placed above the electronic device 200. Power for driving the electronic device cooling apparatus 100 is supplied through the substrate 220. In the figure, ambient air is introduced from above the electronic device cooling apparatus 100. Then, the electronic device cooling apparatus 100 allows a jet of air to impinge on the electronic device 200 as previously described herein.

Figure 5:
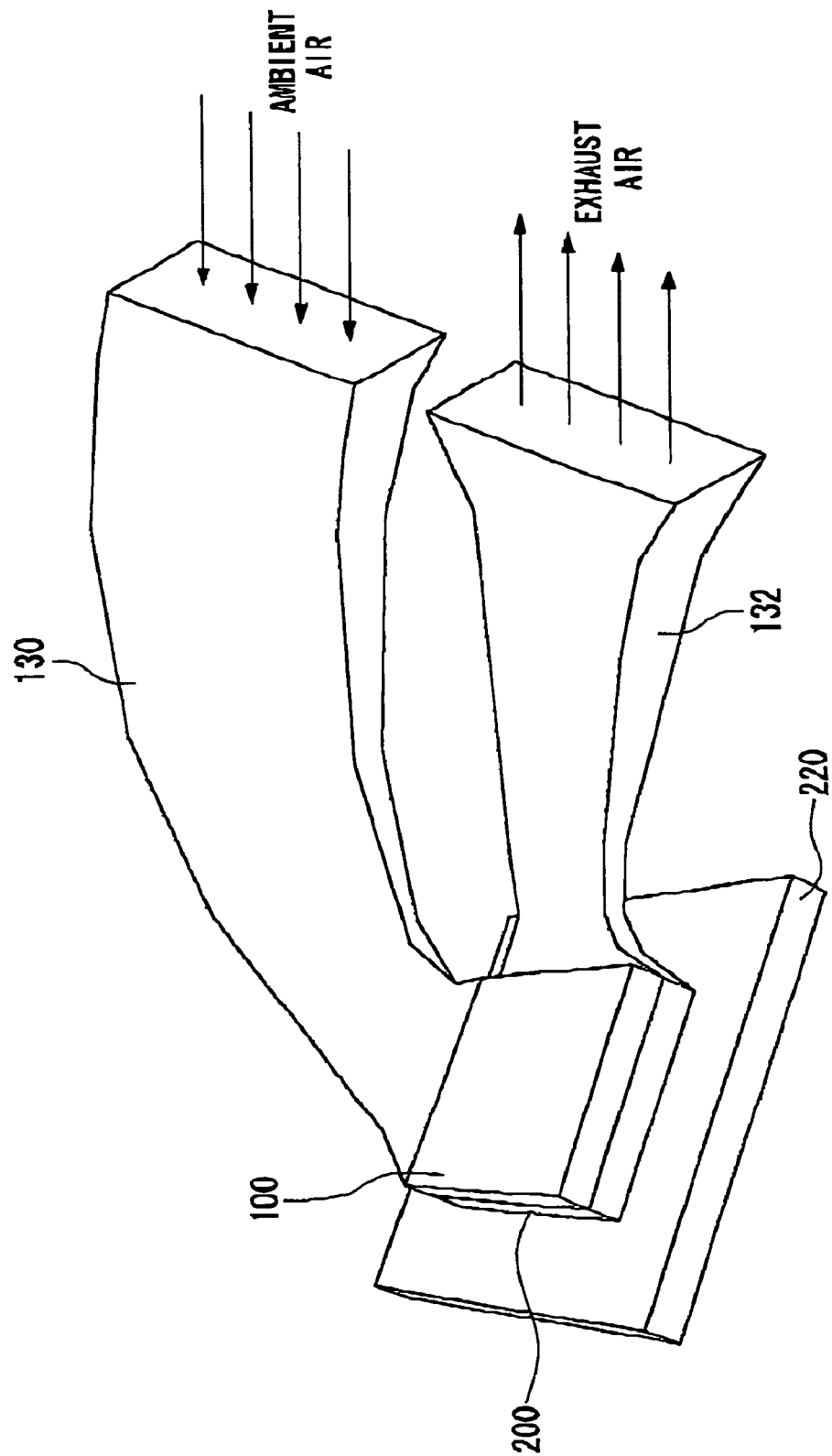
FIG. 5 is a view showing the external appearance of an electronic device cooling apparatus with a coolant of a gas.

FIG. 5 is a schematic view showing the electronic device cooling apparatus 100 that is operating using an air coolant. Ambient air is supplied to the electronic device cooling apparatus 100 through an ambient air feed passage 130. The electronic device cooling apparatus 100 allows a jet of the air to impinge on the electronic device 200. An air exhaust passage 132 exhausts the air which has been impinged and heated on the electronic device 200. It is also possible to further cool and then feed the exhaust air to the electronic device cooling apparatus 100 through the ambient air feed passage 130.

Figure 6:
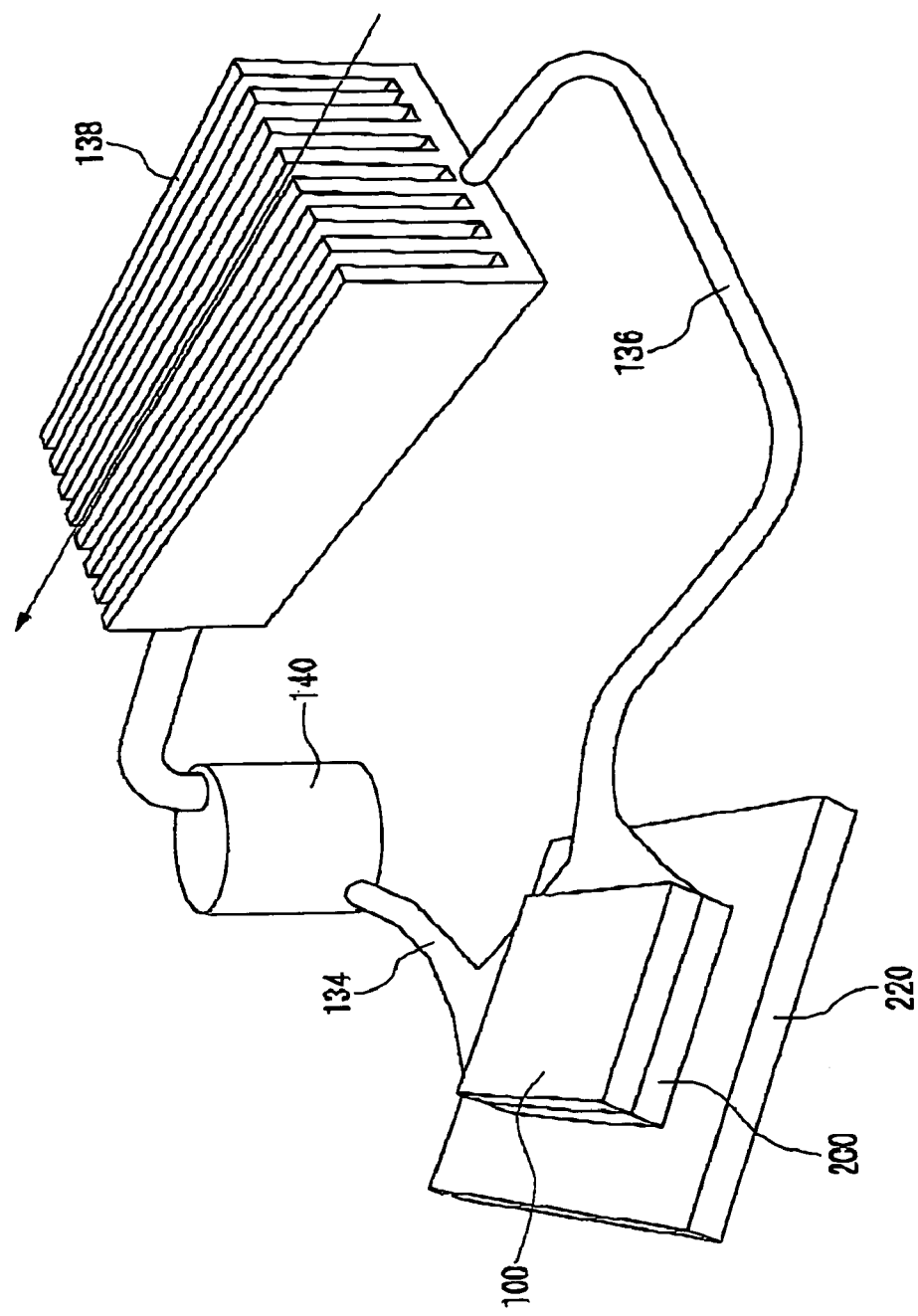
FIG. 6 is a view showing the external appearance of an electronic device cooling apparatus with a coolant of a liquid.

FIG. 6 is a schematic view showing the electronic device cooling apparatus 100 that is operating using a water coolant. A buffer 140 accumulates cooling water. This serves to prevent lack of cooling water to be supplied to the electronic device cooling apparatus 100. The cooling water is supplied to the electronic device cooling apparatus 100 through the liquid feed passage 134. The electronic device cooling apparatus 100 allows a jet of the cooling water to impinge on the electronic device 200. The cooling water that has been heated by the heat generated on the surface of the electronic device 200 is collected through a return passage 136 into a condensing unit 138. The cooling water may be returned using capillary force as is known to those skilled in the art or using power such as by pumps. The condensing unit 138 allows ambient air to cool the returned cooling water. The cooling water is supplied back to the electronic device cooling apparatus 100 via the buffer 140. The coolant may also be a highly volatile liquid such as alcohol.

The passages such as the liquid feed passage 134 and the return passage 136, through which a liquid flows, may be decompressed thereby allowing the heat generated on the surface of the electronic device 200 to vaporize the cooling water. The liquid in the return passage 136 may be collected by capillary force or using pumps. A liquid coolant like water that has a high thermal capacity would serve as a liquid for absorbing heat generated in an electronic device. A liquid coolant like highly volatile alcohol would absorb heat generated in an electronic device by the heat of vaporization of the liquid. In the embodiments, different methods are employed in feeding a coolant depending on whether the coolant is a gas or liquid; however, the coolant is emitted in the same manner.

Figure 7:
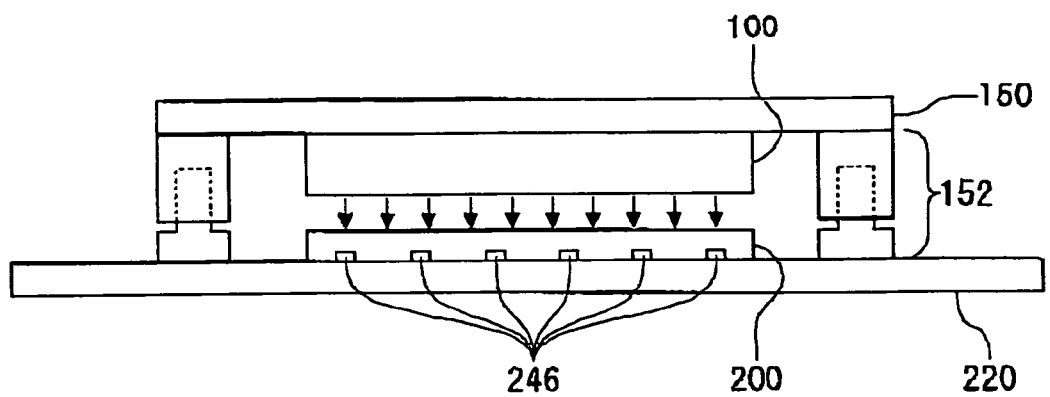
FIG. 7 is a view showing an electronic device cooling apparatus installed in an exemplary manner.

FIG. 7 is a view showing the electronic device cooling apparatus 100 installed in an exemplary manner. The electronic device cooling apparatus 100 is placed on a top substrate 150 so as to oppose the electronic device 200. Connecters 152 align the electronic device cooling apparatus 100 with the electronic device 200. Power for driving the electronic device cooling apparatus 100 is fed through the substrate 220 to the electronic device cooling apparatus 100 via the connecters 152 and the top substrate 150. Likewise, a control signal for driving the cooling nozzles 110 embedded in the electronic device cooling apparatus 100 is also transferred through the substrate 220 via the same path. Each of the movable-membrane drive units 108 embedded in the electronic device cooling apparatus 100 drives the movable membrane 106 in accordance with the control signal passed through the substrate 220, thereby causing the coolant to be emitted. Temperature sensors 246 are embedded at their respective units in the electronic device 200 to detect thermal distribution states.

Figure 8:
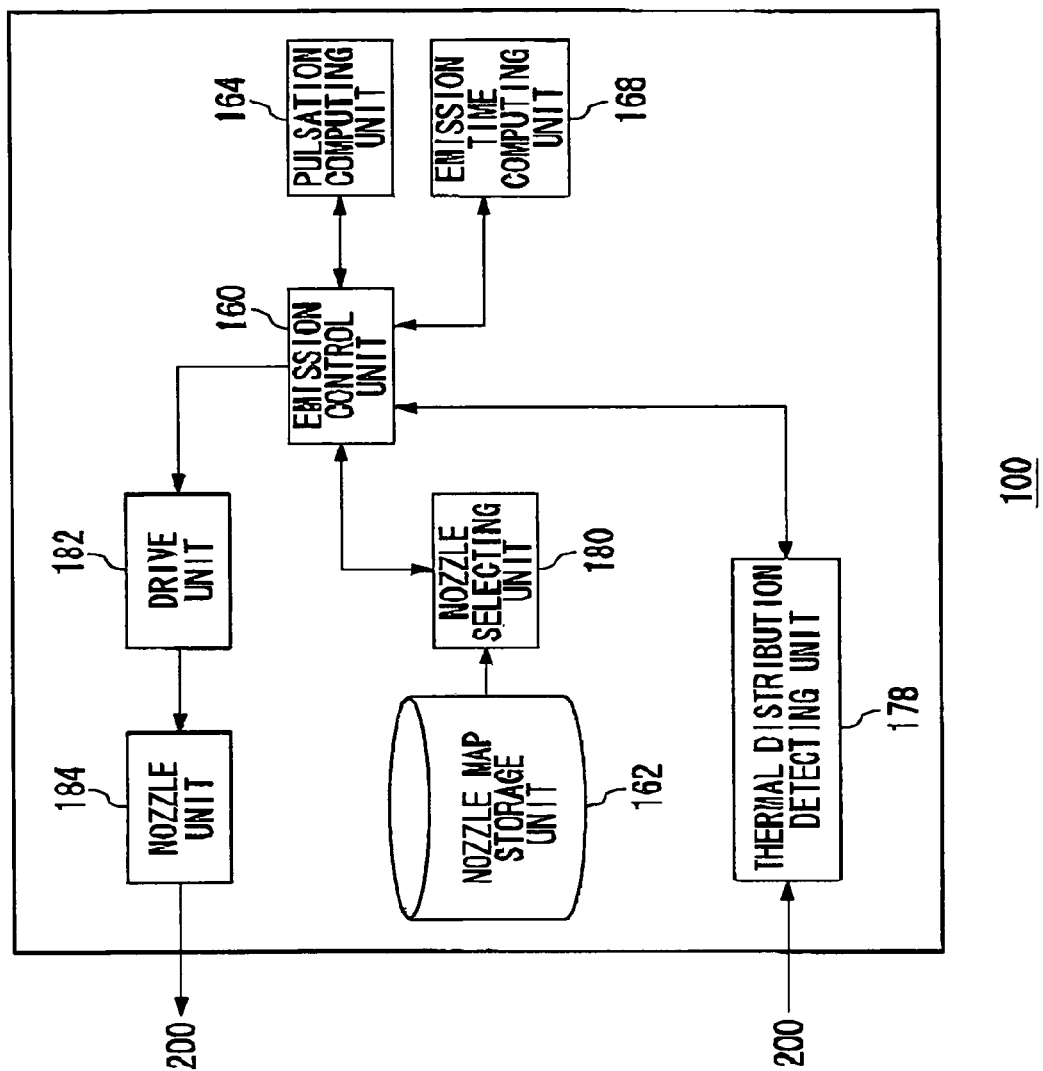
FIG. 8 is a functional block diagram showing an electronic device cooling apparatus according to a first embodiment.

FIG. 8 is a functional block diagram showing the electronic device cooling apparatus 100. Each of the blocks shown in the figure can be implemented hardware-wise using elements including computer CPUs or mechanical mechanisms or software-wise using computer programs. However, the functional blocks shown are implemented in combination of hardware and software. Accordingly, it will be appreciated by those skilled in the art that these functional blocks can be realized in a variety of forms depending on the combination of hardware and software.

An emission control unit 160 collectively controls the cooling nozzles 110. A drive unit 182 drives a nozzle unit 184 including the cooling nozzles 110 in response to an instruction from the emission control unit 160 to emit a jet of coolant. The emission control unit 160 may control the drive unit 182 so that all the cooling nozzles 110 are controlled in the same manner as a shower is. As shown in FIG. 1, the jet cooling has a great cooling effect in the vicinity of a jet axis point. Such control has a great effect particularly when the cooling nozzles 110 are densely embedded in the electronic device cooling apparatus 100 or when the cooling nozzle 110 is locally placed corresponding to the unit that is predicted to generate heat on the surface of the electronic device 200. There is a merit with this control because it is simple and can be realized at low costs.

Variations and modifications may further be made to the embodiments. Now, three typical embodiments will be explained with reference to each block diagram of FIGS. 8 to 10.

First Embodiment

Referring to FIG. 8, an explanation is given to a case where the emission control unit 160 controls the nozzle unit 184 in accordance with the thermal distribution state of the electronic device 200. A nozzle map storage unit 162 stores data on the placement of each of the cooling nozzles 110 (hereinafter referred to as the "nozzle map"). More specifically, the nozzle map storage unit 162 stores information on coordinates of each of the cooling nozzles 110 with respect to the electronic device 200. The data structure of the nozzle map storage unit 162 will be discussed later in relation to FIG. 11. A nozzle selecting unit 180 selects the cooling nozzles 110, which have their jet axis points in the vicinity of a unit to be cooled, in accordance with a nozzle map stored in the nozzle map storage unit 162.

A thermal distribution detecting unit 178 detects the thermal distribution state on the surface of the electronic device 200. The thermal distribution detecting unit 178 employs the temperature sensors 246 embedded in their respective units in the electronic device 200 to detect the thermal distribution state on the surface of the electronic device 200. The thermal distribution detecting unit 178 detects periodically the thermal distribution state. In accordance with the thermal distribution state detected by the thermal distribution detecting unit 178, the emission control unit 160 instructs the nozzle selecting unit 180 to select a cooling nozzle 110 for cooling a unit that generates the largest amount of heat. The nozzle selecting unit 180 selects the cooling nozzle 110 that should be driven, in accordance with the thermal distribution state detected and the nozzle map stored in the nozzle map storage unit 162. The emission control unit 160 controls the drive unit 182 so that the selected cooling nozzle 110 emits a jet of coolant.

An emission time computing unit 168 calculates the coolant emission time for the cooling nozzle 110. A cooling nozzle 110 that is closer to the unit generating a larger amount of heat on the surface of the electronic device 200 can emit a jet of coolant for a longer period of time to thereby provide greater effects of cooling. When the emission control unit 160 controls each of the cooling nozzles 110 to emit a jet of coolant repeatedly, the ratio between the coolant emission time for each cooling nozzle 110 and the time during which no coolant is emitted (hereinafter referred to as the "duty") may be calculated.

A pulsation computing unit 164 computes a method of controlling each cooling nozzle 110 to pulsate a jet of coolant emitted through each cooling nozzle 110. A jet of coolant emitted through a cooling nozzle 110 corresponding to the jet axis point that is closest to the unit generating the largest amount of heat on the surface of the electronic device 200 will cause the temperature in the vicinity of the jet axis point to reduce. The jet of coolant causes the heat generated in the vicinity of the jet axis point to be absorbed by the coolant while causing the heated coolant to be rejected to around the jet axis point. Another jet of coolant can be emitted, after a certain period of time has elapsed, through another cooling nozzle 110 located in the vicinity of the cooling nozzle 110 that has emitted the first jet of coolant, thereby causing the rejected coolant to be pushed further away from the jet axis point. Control can be provided in the same manner to the cooling nozzles 110 to sequentially emit jets of coolant therethrough to thereby form a pulsing stream of coolant. This makes it possible to effectively remove the quantity of heat absorbed by the coolant.

For example, as shown in FIGS. 5 and 6, control may be provided such that the heated coolant is directed to a heat exhaust hole when it is available for collection of the coolant. On the other hand, even when all the cooling nozzles 110 are simultaneously controlled irrespective of the thermal distribution state, control may also be provided such that the coolant is rejected from the center of the electronic device 200 towards ambient air or the heat exhaust hole.

Second Embodiment

Figure 9:
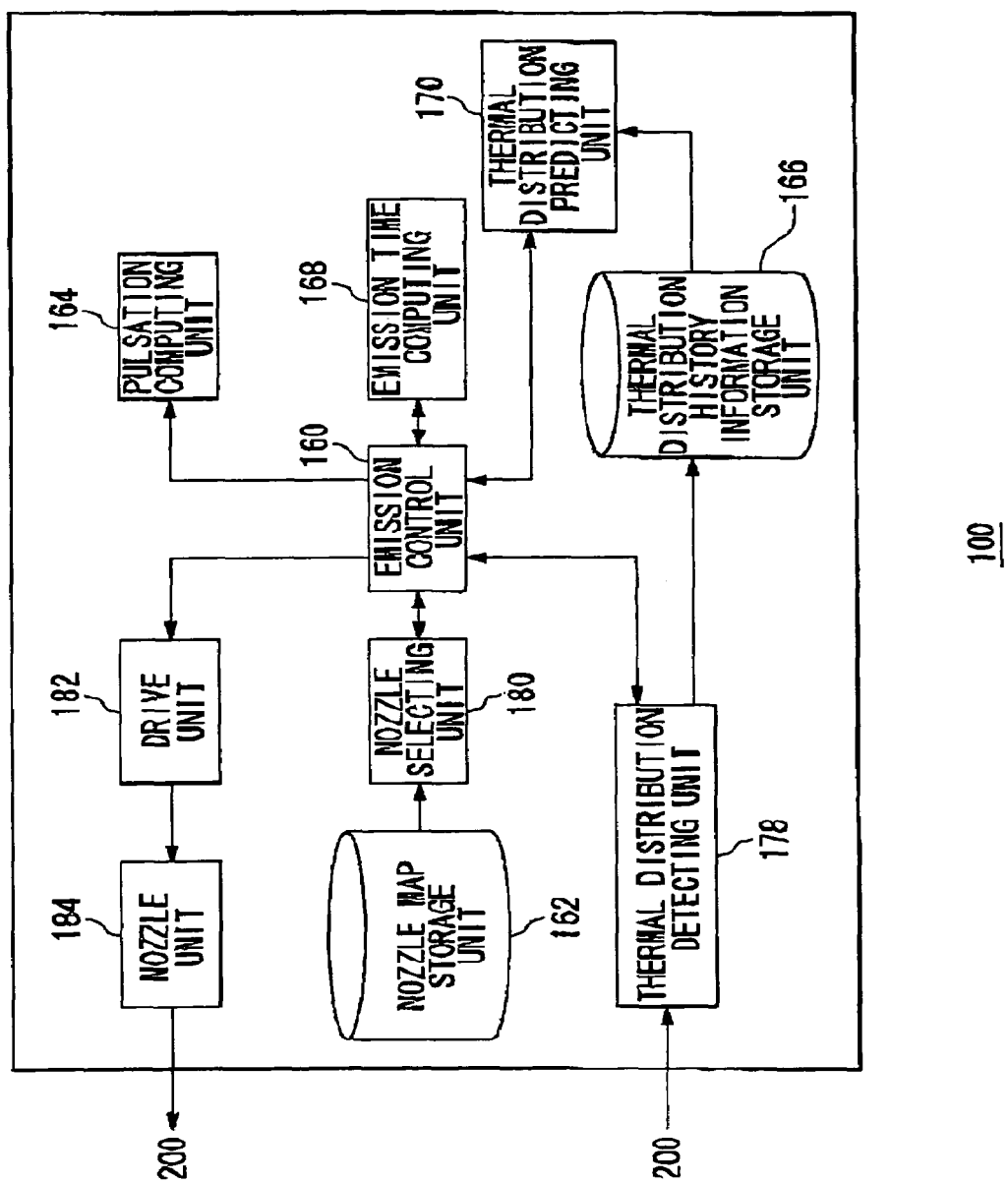
FIG. 9 is a functional block diagram showing an electronic device cooling apparatus according to a second embodiment.

Referring now to FIG. 9, an explanation is given to a case where the emission control unit 160 controls the nozzle unit 184 based on a predicted thermal distribution state of the electronic device 200. Described here is a case where the prediction is made based on thermal distribution history information. In the functional block diagram of FIG. 9, the same components as those of FIG. 8 are indicated with the same reference numerals. A thermal distribution history information storage unit 166 stores thermal distribution history information based on the information on the thermal distribution state periodically detected by the thermal distribution detecting unit 178. The data structure of the thermal distribution history information storage unit 166 will be detailed later. A thermal distribution predicting unit 170 predicts a future thermal distribution state based on the thermal distribution history information stored in the thermal distribution history information storage unit 166. For example, a unit on the surface of the electronic device 200 which continually generates an increasing amount of heat will likely generate a greater amount of heat in the future. Accordingly, control is provided so that such a unit is cooled in advance, thereby preventing the occurrence of a unit at which a predetermined amount of heat generated is exceeded.

For example, to predict a thermal distribution state at a predetermined unit on the surface of the electronic device 200, the moving average method may be employed to predict a future temperature based on the temperatures detected several times in the past. The emission control unit 160 may record the coolant emission history information on a storage medium. The emission history information is indicative of the coolant emission timing and the coolant emission time for each of the cooling nozzles 110. The thermal distribution predicting unit 170 may predict thermal distributions in accordance with the coolant emission history information. For example, it is necessary to emit additional jets of coolant to a unit at which the amount of heat generated does not tend to decrease even after some jets of coolant have impinged on the vicinity of the unit. In this case, the coolant emission time for the corresponding cooling nozzle 110 may be further extended or a plurality of cooling nozzles 110 located in the vicinity of the unit of interest may emit jets of coolant at the same time. On the other hand, the amount of heat may increase at a unit to the vicinity of which almost no coolant is emitted. In this case, a jet of coolant may be emitted to the unit for a short period of time for a try to see the change in temperature in order to determine the subsequent control. This makes it possible to adjust the emission of the coolant depending on the unit where heat is generated for a short period of time and the unit where heat is constantly generated.

Third Embodiment

Figure 10:
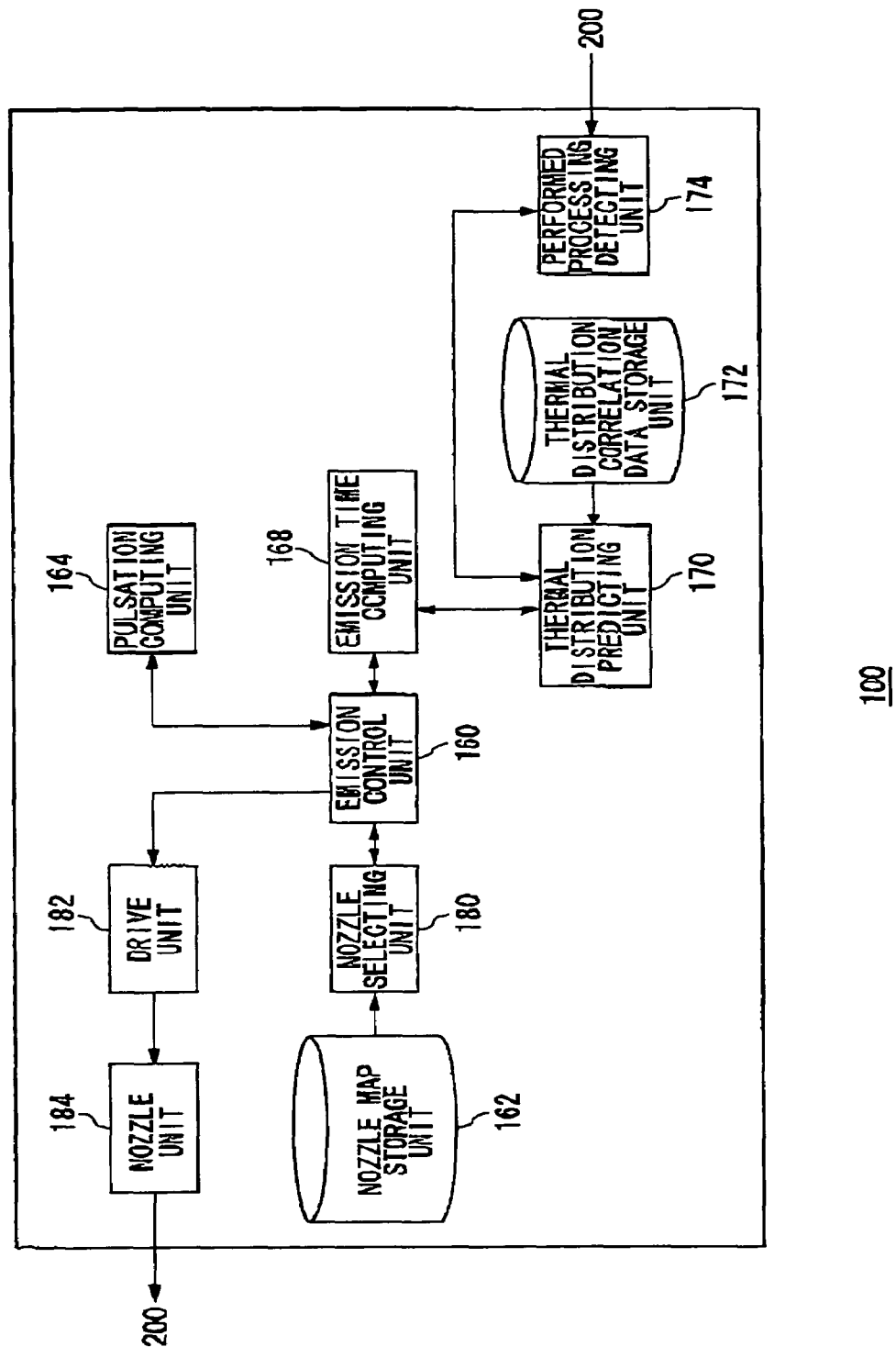
FIG. 10 is a functional block diagram showing an electronic device cooling apparatus according to a third embodiment.

Referring now to FIG. 10, an explanation is given to a case where the emission control unit 160 controls the nozzle unit 184 based on a predicted thermal distribution state of the electronic device 200. Here, described is a case where the thermal distribution state is predicted in accordance with the contents of the processing to be performed by the electronic device 200. In the functional block diagram of FIG. 10, the same components as those of FIGS. 8 and 9 are indicated with the same reference numerals. A performed processing detecting unit 174 determines the contents of the processing to be performed by the electronic device 200. A thermal distribution correlation data storage unit 172 stores the contents of the processing to be performed by the electronic device 200 and thermal distribution correlation data which is the data on a predicted generated-heat distribution that is accordingly predicted. The thermal distribution correlation data correlates the contents of the processing to be performed by the electronic device 200 with the thermal distribution prediction information on a predicted generated-heat distribution on the surface of the electronic device 200 resulting from the execution of steps of the processing. This thermal distribution correlation data is stored and provided on a computer-readable storage medium. This data may also be provided for each computer program to be executed by the electronic device 200. The thermal distribution correlation data may also be corrected as appropriate based on the generated-heat distribution on the surface of the electronic device 200 appearing when the electronic device 200 actually performs each step of the processing. The data structure of the thermal distribution correlation data storage unit 172 will be detailed later. The thermal distribution predicting unit 170 acquires from the thermal distribution correlation data storage unit 172 the thermal distribution correlation data corresponding to the contents to be executed by the electronic device 200 which is obtained by the performed processing detecting unit 174, thereby predicting the amount of heat generated at each unit of the electronic device 200.

Now, the data structure will be explained.

Figure 11:
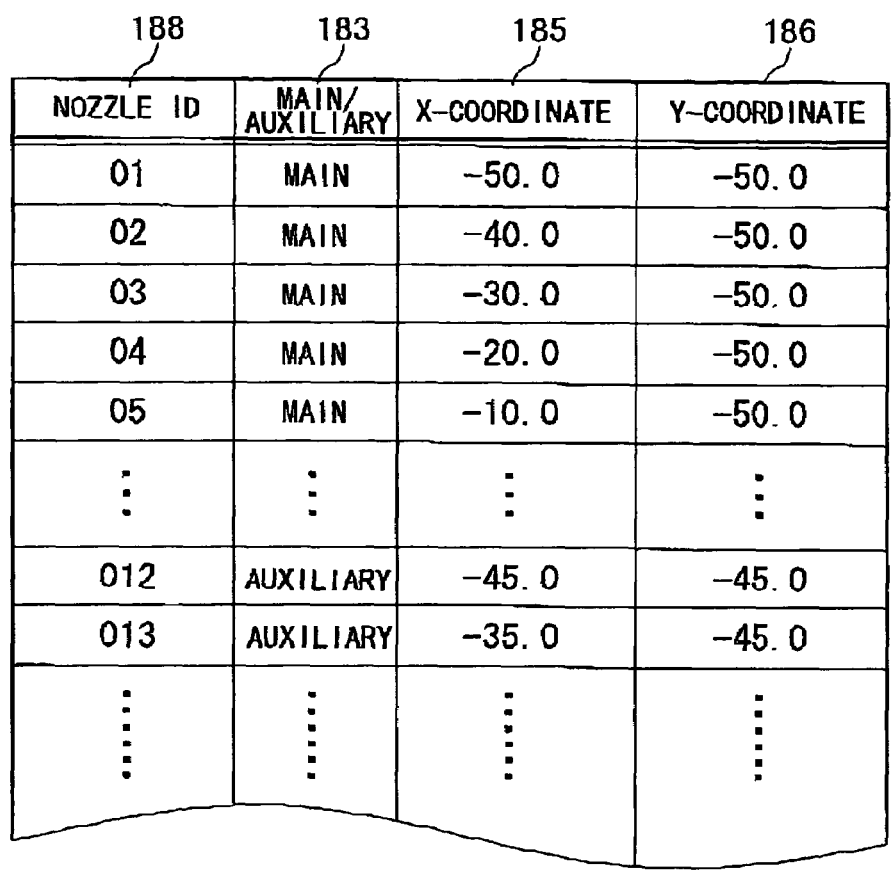
FIG. 11 is a table showing the data structure of a nozzle map storage unit.

FIG. 11 is a table showing the data structure of the nozzle map storage unit 162. As shown in FIG. 3, the nozzle map storage unit 162 stores a nozzle map of the cooling nozzles 110 for the electronic device 200. A nozzle ID column 188 indicates the nozzle ID or an ID number for identifying each cooling nozzle 110. A main/auxiliary column 183 indicates whether each cooling nozzle 110 is a main nozzle or an auxiliary nozzle. An X-coordinate column 185 indicates the X-coordinate of each cooling nozzle 110. A Y-coordinate column 186 indicates the Y-coordinate of each cooling nozzle 110. As used herein, the term "coordinates" refers to those with respect to the opposing electronic device 200. In the figure, with the center coordinates (0, 0) of the electronic device 200, the cooling nozzles 110 are placed in rows and columns with four vertices at (−50, 50), (−50, −50), (50, −50), and (50, 50). Referring to FIG. 11, for example, the cooling nozzle 110 having an nozzle ID "03" is a main nozzle with its coordinates (−30, −50).

FIG. 12 is a table showing the data structure of the thermal distribution history information storage unit 166. The thermal distribution history information storage unit 166 stores, as the thermal distribution history information, the thermal distribution state on the surface of the electronic device 200 detected periodically by the thermal distribution detecting unit 178. As previously described herein, the temperature sensors 246 disposed at a plurality of units of the electronic device 200 detect the thermal distribution state on the surface of the electronic device 200. For this purpose, several "temperatures sensed positions" are set on the surface of the electronic device 200. A position ID column 190 indicates a position ID or an ID number for identifying these temperature sensed positions. An X-coordinate column 192 indicates the X-coordinate of a temperature sensed position. A Y-coordinate column 194 indicates the Y-coordinate of a temperature sensed position. As used herein, the term "coordinates" refers to those with respect to the opposing electronic device 200. Among the thermal distribution information acquired periodically by the thermal distribution detecting unit 178, a time t1 column 196 indicates a previously obtained temperature (° C.) at each temperature sensed position. A time t2 column 198 indicates a second previously obtained temperature at each temperature sensed position. In this manner, each of the time t1 column 196 to a time t10 column 208 indicates a temperature at each temperature sensed position.

For example, the coordinates of a temperature sensed position having a position ID of "01" are (−50, −50). The temperature at that position suddenly increases as 50.0° C., 60.0° C., and 68.5° C. Therefore, the thermal distribution predicting unit 170 of FIG. 9 predicts that the temperature at coordinates (−50, −50) will likely further increase. The nozzle selecting unit 180 searches the nozzle map stored in the nozzle map storage unit 162 for a cooling nozzle 110 that has its jet axis point in the vicinity of the position ID "01." Referring to FIG. 11, since the jet axis point of the cooling nozzle 110 of nozzle ID "01" (a main nozzle) just corresponds to this position, the emission control unit 160 controls this cooling nozzle 110 to mainly emit a jet of coolant.

FIG. 13 is a table showing the data structure of the thermal distribution correlation data storage unit 172. The thermal distribution correlation data storage unit 172 stores the thermal distribution correlation data for each of the contents of the processing to be performed by the electronic device 200. A process ID column 230 indicates a process ID or an ID number for identifying the contents of the processing to be performed by the electronic device 200. A position ID01 column 232 indicates the temperature prediction information at a position ID "01" shown in the position ID column 190 of FIG. 12. Likewise, a position ID02 column 234 to a position ID36 column 244 also indicate temperature prediction information at each position ID. In the table, "A" shows a unit where an increase in temperature will be expected as the processing is performed. On the other hand, "B" indicates a unit where an increase in temperature, although not as significant as "A," is expected. "C" indicates a unit where no significant increase in temperature is expected.

For example, it is shown that performing the processing of process ID "0004" will cause a significant increase in temperature particularly at units corresponding to position IDs "02" and "03." Suppose that the performed processing detecting unit 174 of FIG. 10 detects that the electronic device 200 is performing or scheduled to perform the processing of process ID "0004." In this case, the thermal distribution predicting unit 170 acquires corresponding data from the thermal distribution correlation data stored in the thermal distribution correlation data storage unit 172. Referring to FIG. 13, a significant increase in temperature is expected particularly at position IDs "02" and "03" as the processing of process ID "0004" is performed. The nozzle selecting unit 180 accesses the nozzle map storage unit 162 to select the cooling nozzles 110 that have their jet axis points in the vicinity of the position IDs "02" and "03."

Then, the emission control unit 160 controls the cooling nozzles 110 selected to emit a jet of coolant with a predetermined timing. Since the thermal distribution predicting unit 170 predicts a unit, where the temperature will likely rise, in accordance with the contents of the processing to be performed by the electronic device 200, the unit can be cooled in advance. The thermal distribution correlation data may be set by the user in advance corresponding to the electronic device 200 to be cooled. Alternatively, the application software may have its own thermal distribution correlation data. In this case, the thermal distribution correlation data may be stored in the thermal distribution correlation data storage unit 172 as the application software is installed.

The first to third embodiments have been described separately; however, these embodiments can be combined for implementation. For example, control is typically provided such that all the cooling nozzles 110 emit jets of coolant at the same time. However, corresponding to the thermal distribution detecting unit 178 detecting a local thermal distribution, such a scheme may be switchably employed that provides individual control to each cooling nozzle 110. On the other hand, the emission control unit 160 may control the nozzle unit 184 based on both the thermal distribution information detected by the thermal distribution detecting unit 178 and the thermal distribution information predicted by the thermal distribution predicting unit 170. This prediction may be made based on the thermal distribution history information, the thermal distribution correlation data, or both thereof. The thermal distribution correlation data may be corrected as appropriate based on the thermal distribution state detected by the thermal distribution detecting unit 178. This makes the thermal distribution correlation data more accurate. It will be appreciated by those skilled in the art that these various combinations are included within the scope of the present invention.

Figure 14:
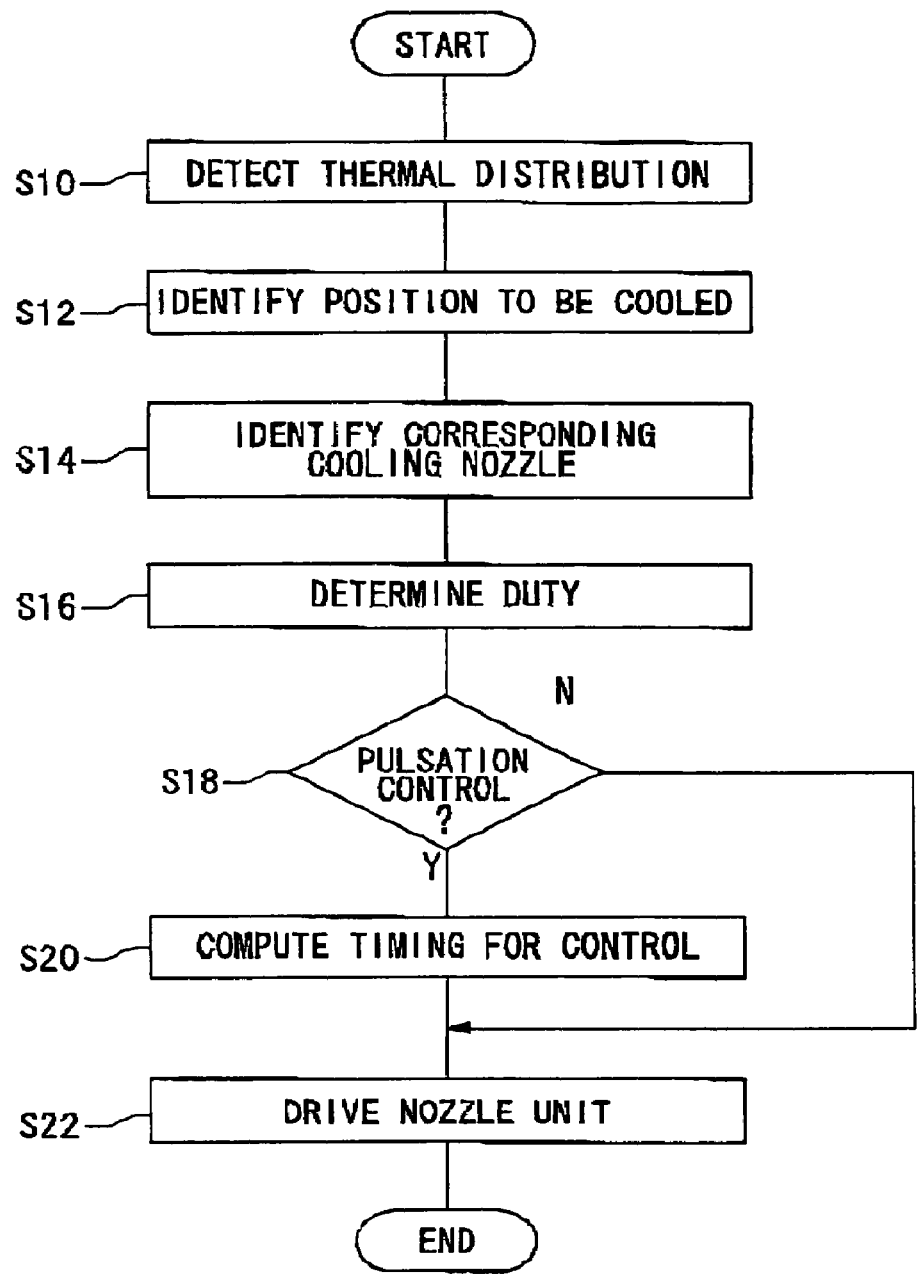
FIG. 14 is a flowchart showing the process of detecting a thermal distribution up to the process of emitting a coolant according to the first embodiment.

FIG. 14 is a flowchart showing the process of detecting a thermal distribution up to the process of emitting a jet of coolant in the first embodiment. An explanation is given corresponding to FIG. 8. First, the thermal distribution detecting unit 178 detects the thermal distribution state on the surface of the electronic device 200 (S10). The emission control unit 160 identifies the unit to be cooled in accordance with the thermal distribution state detected (S12). The nozzle selecting unit 180 receives an instruction from the emission control unit 160 to identify the cooling nozzle 110 that is to emit a jet of coolant in accordance with the nozzle map stored in the nozzle map storage unit 162 (S14). The emission time computing unit 168 receives an instruction from the emission control unit 160 to determine the duty of the coolant emission (S16). The emission time computing unit 168 also determines the timing of emitting the coolant. As previously described herein, when control is provided to form a pulsing stream of coolant ("Y" in S18), the pulsation computing unit 164 computes the timing of driving the cooling nozzle 110 to provide for this control (S20). The emission control unit 160 instructs the drive unit 182 to drive a predetermined cooling nozzle 110 in accordance with these computations (S22).

Figure 15:
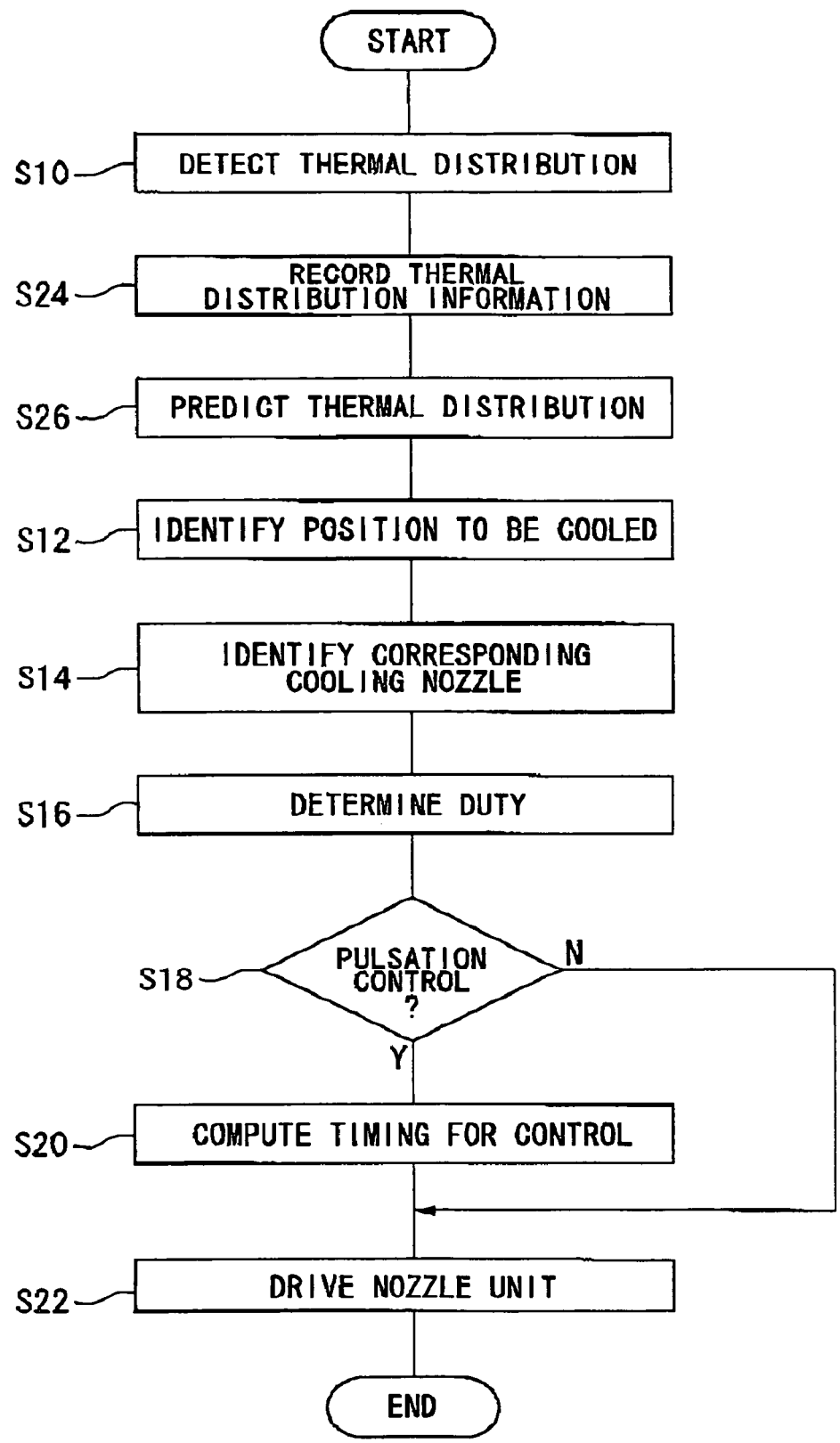
FIG. 15 is a flowchart showing the process of detecting a thermal distribution up to the process of emitting a coolant according to the second embodiment.

FIG. 15 is a flowchart showing the process detecting a thermal distribution up to the process emitting a jet of coolant in the second embodiment. An explanation is given corresponding to FIG. 9. The thermal distribution detecting unit 178 detects the thermal distribution state on the surface of the electronic device 200 (S10) and then records the thermal distribution history information in the thermal distribution history information storage unit 166 (S24). The thermal distribution predicting unit 170 predicts a future thermal distribution based on the thermal distribution history information stored in the thermal distribution history information storage unit 166 (S26). The subsequent steps are the same as in FIG. 14.

Figure 16:
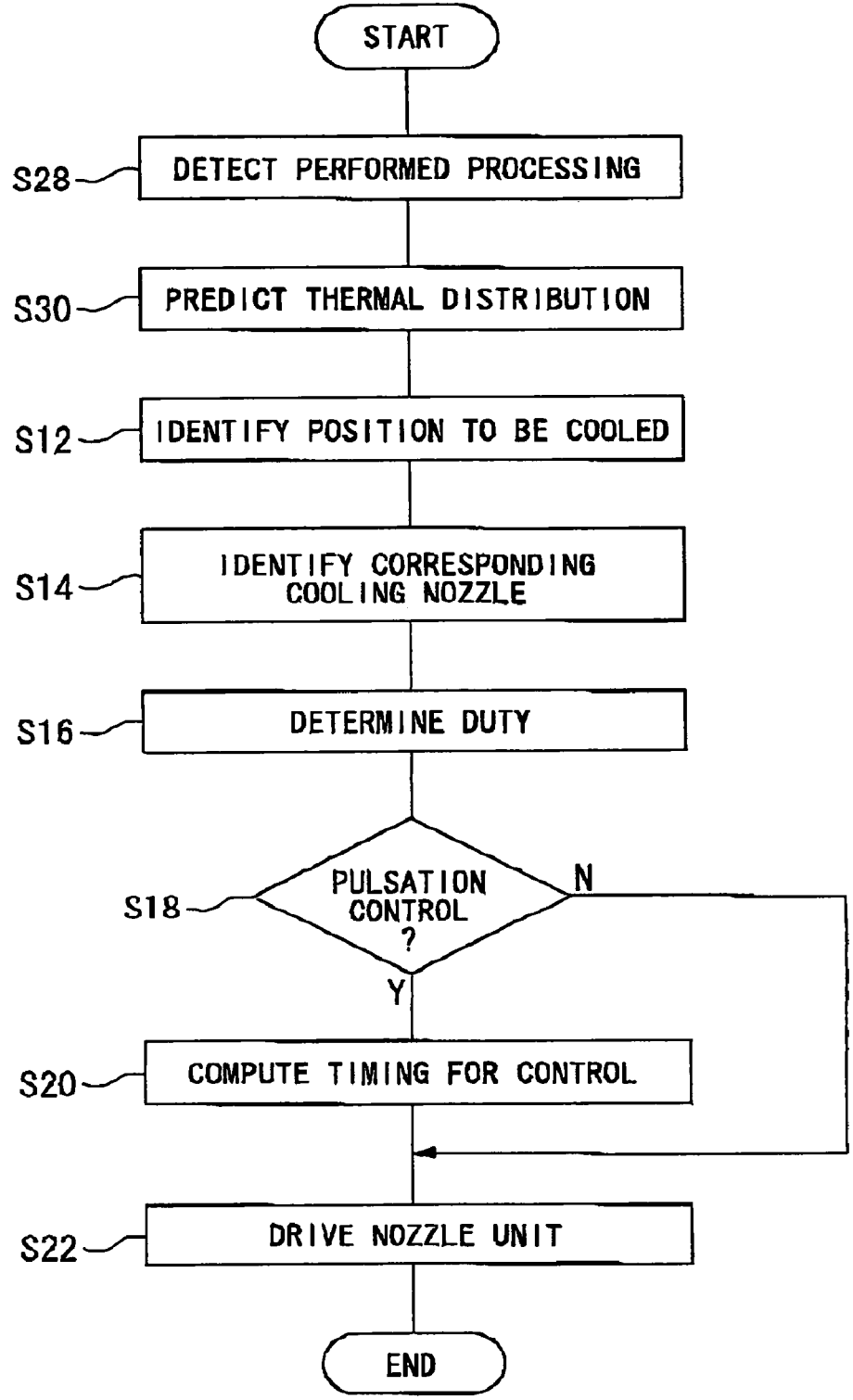
FIG. 16 is a flowchart showing the process of detecting the processing performed by an electronic device up to the process of emitting a coolant according to the third embodiment.

FIG. 16 is a flowchart showing the process detecting the processing performed by the electronic device 200 up to the process emitting a jet of coolant in the third embodiment. An explanation is given corresponding to FIG. 10. First, the performed processing detecting unit 174 detects the processing performed by the electronic device 200 (S28). The thermal distribution predicting unit 170 predicts a thermal distribution based on the thermal distribution correlation data stored in the thermal distribution correlation data storage unit 172 (S30). The subsequent steps are the same as in FIG. 14.

As described above, according to the embodiments, the jet cooling can realize it with low thermal resistance to cool electronic devices that have localized thermal distributions. Control is provided such that a jet of coolant is emitted to a unit generating a large amount of heat or a unit expected to generate a larger amount of heat, thereby making it possible to equalize the temperature on the surface of the electronic device. This has an advantageous effect on prevention of the electronic device, or semiconductors such as transistors in particular, from increasing in temperature leading to abnormal operations. This in turn has an effect on improvement of the durability and processing reliability of the electronic device itself.

Since control can be provided so as to cool only a unit in an electronic device required to be cooled, it is possible to reduce the amount of coolant used for emission or power required for emission. With a system for feeding a coolant to an electronic device cooling apparatus or a system for collecting the coolant used, the same technology as has been used in the conventional air cooling and liquid cooling methods can be employed without any change being made thereto. Feedback control being provided based on the thermal distribution state detected by a temperature sensor would makes it possible to employ only the electronic device cooling apparatus to realize autonomous temperature control. It is also possible to provide more sophisticated temperature control in cooperation with a heat radiating mechanism such as an electric fan.

In the foregoing, the present invention has been described in accordance with the embodiments. The present invention is not limited these embodiments, and various modifications may be made thereto without departing from the scope of the invention.

As such a modification, control may be provided to select which is mainly used, an electric fan or a jet of coolant, depending on the temperature of coolant. For example, when the coolant is heated due to the heat from the electronic device, control may be shifted to cooling by means of an electric fan until the heated coolant is cooled down. Alternatively, control may be provided so as to effect cooling by means of an electric fan when the entire electronic device is generating heat, while a jet of coolant may be employed when the electronic device is locally generating heat.

On the other hand, the apparatus may be designed to learn a method for effectively controlling cooling nozzles in accordance with coolant emission history, thermal distribution history information, thermal correlation data, and thermal distribution information. Different types of coolant may also be employed for main and auxiliary nozzles.

The present invention is applicable as a technique for cooling an electronic device that controls electronic products.

What is claimed is:

1. An electronic device cooling apparatus comprising:
   a nozzle unit which has a plurality of cooling nozzles placed proximately opposite to a surface of an electronic device;
   a drive unit which actuates a coolant introduced into the nozzle unit to emit the coolant through the cooling nozzles; and
   an emission drive control unit which refers to information on coordinates with respect to the electronic device, selects at least one of the cooling nozzles which emits along a jet axis a jet stream impinging upon the surface of the electronic device in a vicinity of a portion to be cooled, and controls an emission drive capacity of the drive unit so as to cause at least one of the cooling nozzles thus selected to emit a coolant.

2. An electronic device cooling apparatus comprising:
   a nozzle unit which has a plurality of cooling nozzles placed proximately opposite to a surface of an electronic device;
   a drive unit which actuates a coolant introduced into the nozzle unit to emit the coolant through the cooling nozzles; and
   an emission drive control portion which controls an emission drive capacity of the drive unit, wherein:
   the nozzle unit comprises a main set of nozzles and a sub set of nozzles;
   the main and sub sets of nozzles each have a plurality of the cooling nozzles arranged densely; and
   in a horizontal direction to the surface of the electronic device, the main and sub sets of nozzles are placed in a shifted configuration; and,
   wherein the emission drive control unit refers to information on coordinates with respect to the electronic device, selects at least one of the cooling nozzles which emits along a jet axis a jet stream impinging upon the surface of the electronic device in a vicinity of a portion to be cooled, and controls the emission drive capacity of the drive unit so as to cause at least one of the cooling nozzles thus selected to emit a coolant.

3. The electronic device cooling apparatus according to claim 2, wherein
   in the normal direction to the surface of the electronic device, the main and sub sets of nozzles are placed in a staggered configuration.

4. The electronic device cooling apparatus according to claim 1, further comprising a thermal distribution detecting sensor which detects a thermal distribution state on the surface of the electronic device, and wherein
   the emission drive control unit controls the drive unit in accordance with the thermal distribution state detected.

5. The electronic device cooling apparatus according to claim 4, wherein
   the emission drive control unit also controls a coolant emission duration, during which the drive unit allows the at least one of the cooling nozzles thus selected to emit the coolant therethrough, in accordance with the thermal distribution state detected.

6. The electronic device cooling apparatus according to claim 1, wherein
   the emission drive control unit controls the drive unit such that a jet of the coolant is emitted by the at least one of the cooling nozzles thus selected corresponding to the position most desired to be cooled and then by its surrounding cooling nozzles in sequence.

7. The electronic device cooling apparatus according to claim 6, wherein
the emission drive control unit controls the drive unit to form a pulsing stream of the coolant in a predetermined direction.

8. The electronic device cooling apparatus according to claim 7, wherein
the emission drive control unit controls the drive unit such that the pulsing stream of the coolant formed is directed to a heat exhaust hole.

9. The electronic device cooling apparatus according to claim 1, further comprising a thermal distribution predicting unit which predicts a thermal distribution state on the surface of the electronic device, and wherein
the emission drive control unit controls the drive unit in accordance with the thermal distribution state predicted.

10. The electronic device cooling apparatus according to claim 9, wherein
the thermal distribution predicting unit predicts a thermal distribution state in accordance with the contents of processing that is to be performed by the electronic device.

11. An electronic device cooling apparatus comprising:
a nozzle unit which has a plurality of cooling nozzles placed proximately opposite to a surface of an electronic device;
a drive unit which actuates a coolant introduced into the nozzle unit to emit the coolant through each of the cooling nozzles;
a thermal distribution detecting sensor which detects a thermal distribution state on the surface of the electronic device;
a nozzle selecting unit which identifies a position to be cooled in accordance with the thermal distribution state detected and selecting at least one of the cooling nozzles corresponding to the position identified; and
an emission drive control unit which allows the drive unit to emit the coolant through the at least one of the cooling nozzles thus selected.

12. The electronic device cooling apparatus according to claim 11, further comprising an emission duration computing unit which calculates a coolant emission duration for the at least one of the cooling nozzles thus selected in accordance with the thermal distribution state detected, and wherein
the emission drive control unit allows the drive unit to emit the coolant through the at least one of the cooling nozzles thus selected for a duration of the coolant emission duration calculated.

13. The electronic device cooling apparatus according to claim 11, further comprising;
a thermal distribution detecting sensor which detects a thermal distribution state on the surface of the electronic device; and
an emission timing computing unit which calculates a coolant emission timing for the at least one of the cooling nozzles thus selected in accordance with the thermal distribution state detected, and wherein
the emission drive control unit allows the drive unit to emit the coolant through the at least one of the cooling nozzles thus selected with the calculated coolant emission timing.

14. A method for cooling an electronic device comprising:
controlling a coolant introducing mechanism to cause a coolant to be introduced into a plurality of cooling nozzles placed proximately opposite to a surface of an electronic device;
referring to information on coordinates with respect to the electronic device, and selecting at least one of the cooling nozzles which emits along a jet axis a jet stream impinging upon the surface of the electronic device in a vicinity of a portion to be cooled; and
controlling a coolant emission mechanism to emit the coolant to impinge on the surface of the electronic device placed in proximity to the cooling nozzles through the at least one of the cooling nozzles thus selected.

15. A method for cooling an electronic device comprising:
controlling a coolant introducing mechanism to cause a coolant to be introduced into a plurality of cooling nozzles;
sensing a thermal distribution state, produced due to heat produced by a plurality of processor modules integrated in the electronic device, on a surface of the electronic device based on an output value from a thermal sensor;
identifying a position to be cooled on the surface of the electronic device in accordance with the detected thermal distribution state;
selecting, from the plurality of cooling nozzles, at least one of the cooling nozzles corresponding to the identified position; and
controlling a coolant emission mechanism to emit the coolant through the at least one of the cooling nozzles thus selected.

16. The method for cooling an electronic device according to claim 15, further comprising calculating a coolant emission duration for the at least one of the cooling nozzles thus selected in accordance with the detected thermal distribution state.

17. The method for cooling an electronic device according to claim 15, further comprising calculating a coolant emission timing for the at least one of the cooling nozzles thus selected in accordance with the detected thermal distribution state.

18. An electronic device cooling apparatus comprising:
a nozzle unit which has a plurality of cooling nozzles placed proximately opposite to a surface of an electronic device in which a plurality of processor modules are integrated;
a drive unit which actuates a coolant introduced into the nozzle unit to emit the coolant through the cooling nozzles; and
an emission drive control portion which controls an emission drive capacity of the drive unit, wherein
the plurality of cooling nozzles are placed proximately so that a jet axis of each of the nozzles is placed immediately above a respective one of the plurality of processor modules embedded in the electronic device; and,
wherein the emission drive control unit refers to information on coordinates with respect to the electronic device, selects at least one of the cooling nozzles which emits along a jet axis a jet stream impinging upon the surface of the electronic device in a vicinity of a portion to be cooled, and controls the emission drive capacity of the drive unit so as to cause at least one of the cooling nozzles thus selected to emit a coolant.

19. The electronic device cooling apparatus according to claim 1, further comprising a thermal distribution history information storage portion which stores thermal distribution history information indicating time-dependent change in thermal distribution on the surface of the electronic device, wherein the emission drive control portion selects, in accordance with the thermal distribution history information, at least one of the cooling nozzles which emits along a jet axis a jet stream impinging upon the surface of the electronic device in a vicinity of a portion to be cooled.

* * * * *